United States Patent [19]
Hu

[11] Patent Number: 5,972,567
[45] Date of Patent: Oct. 26, 1999

[54] METHOD AND APPARATUS FOR PERFORMING A DOUBLE SHIFT PRINT ON A SUBSTRATE

[75] Inventor: Bernie B. Hu, Beaverton, Oreg.

[73] Assignee: Intel Corporation, Santa Clara, Calif.

[21] Appl. No.: 08/772,087

[22] Filed: Dec. 20, 1996

[51] Int. Cl.⁶ ...................................................... G03F 7/20
[52] U.S. Cl. ........................... 430/312; 430/394; 430/396
[58] Field of Search ..................... 430/311, 312, 430/394, 396, 397; 250/492.2

[56] References Cited

U.S. PATENT DOCUMENTS

| 5,281,996 | 1/1994 | Bruning et al. | 355/77 |
| 5,503,959 | 4/1996 | Langston | 430/394 |

FOREIGN PATENT DOCUMENTS

| 1-258419 | 10/1989 | Japan | 430/397 |
| 3-1522 | 1/1991 | Japan | 430/394 |

OTHER PUBLICATIONS

Silicon Processing For The VLSI Era, vol. 1—Process Technology, S. Wolf and R.N. Tauber, pp. 407–492.
"Product Description for the Micrascan II", pp. 1–1—4–4, Nov. 11, 1994.
"The Ultimate Lithography Solution For 0.5 μm to 0.25 μm", 4 pages., 1992.

*Primary Examiner*—Kathleen Duda
*Attorney, Agent, or Firm*—Blakely, Sokoloff, Taylor & Zafman LLP

[57] ABSTRACT

A method and apparatus for printing a feature having a reduced critical dimension on a photoresist-coated semiconductor wafer are disclosed. The method comprises the steps of positioning the wafer relative to the reticle at a first shifted position, exposing a first region of the wafer to radiant energy through a pattern transfer tool to define a first side of the feature, positioning the wafer relative to the pattern transfer tool at a second shifted position, and exposing a second region of the wafer to radiant energy through the pattern transfer tool to define a second side of the feature.

10 Claims, 13 Drawing Sheets ively. Irradiation of positive photoresist induces a chemical reaction to render the irradiated regions of the positive photoresist soluble in developer. As FIG. 1B illustrates, after the development step, only regions 121 and 122 remain of the photoresist layer 120 depicted in FIG. 1A. Thus, the pattern formed in the positive photoresist is a positive image of the opaque regions 131 and 132 on the pattern transfer tool 130 of FIG. 1A. Due to resolution limitations inherent in presently available negative photoresist materials, positive photoresist is used almost exclusively in microlithographic printing of submicron features. For this reason, the present invention is discussed primarily in terms of microlithographic printing in positive photoresist. It will be appreciated, however, that the apparatus and method of the present invention may be used to print features in either positive or negative photoresist.

METHOD AND APPARATUS FOR PERFORMING A DOUBLE SHIFT PRINT ON A SUBSTRATE

BACKGROUND OF THE INVENTION

(1) Field of the Invention

The present invention relates to the field of microcircuit fabrication. More specifically, the present invention relates to a method and apparatus for microlithographic printing.

(2) Art Background

MICROLITHOGRAPHIC PROCESS

FIG. 1A illustrates a microlithographic printing process. A pattern transfer tool 130 is interposed between a source of radiant energy 165 and a semiconductor wafer 101. The semiconductor wafer 101 includes a film disposed between a semiconductor substrate 100 and a layer of photoresist 120. Herein, film 110 is described as being a layer of polysilicon 110, but may also be a metal, an interlayer dialectric (ILD) or any other film in which features are to be patterned. The pattern 135 transfer tool 130, which may be a mask or reticle, includes a pattern of opaque regions 131 and 132 thereon. Radiant energy 105 striking the pattern transfer tool 130 is blocked at opaque regions 131 and 132, but otherwise passes through the pattern transfer tool to irradiate regions in the photoresist layer 120 of the wafer 101. As FIG. 1A illustrates, the effect of exposing the wafer 101 to radiant energy 105 through the pattern transfer tool 130 is to irradiate regions of the photoresist layer 120 in a pattern defined by the opaque regions 131 and 132 on the pattern transfer tool 130. The features defined by opaque regions 131 and 132 on the pattern transfer tool 130 are said to be "printed" on the wafer surface and the process of exposing the photoresist-coated wafer 101 to radiant energy 105 is referred to herein as "printing".

The photoresist of layer 120 includes a photoactive compound which chemically reacts when exposed to radiant energy, typically actinic light. In one type of photoresist, known as negative photoresist, irradiation induces a "crosslinking" chemical reaction to render the irradiated regions in the photoresist insoluble in a solvent called "developer". After application of developer, referred to as the "development step", non-irradiated regions 121 and 122 of photoresist layer 120 are removed. Consequently, the pattern formed in the negative photoresist layer is the negative of the pattern defined by the opaque regions 131 and 132 of the pattern transfer tool 130.

FIG. 1B illustrates the state of the semiconductor wafer 101 after irradiation and development of a positive photoresist.

After the wafer has been developed to the state shown in FIG. 1B, an etching compound is applied to etch away the regions of polysilicon layer 110 not covered by the remaining regions of photoresist 121 and 122, thereby revealing regions of the substrate 100. The result, shown in FIG. 1C, is a reproduction of the image on the pattern transfer tool in the polysilicon layer (element 110 of FIGS. 1A and 1B). At this point, the remaining photoresist regions 121 and 122 can be stripped away leaving only features 111 and 112 in what was the polysilicon layer 110 of FIGS. 1B and 1A. When surrounded by wells of appropriately doped substrate, the polysilicon features 111 and 112 define gates of field-effect transistors (FET).

THE CRITICAL DIMENSION

The minimum width of an isolated line that can be printed by a microlithographic process, referred to as the "critical dimension", is one of the process's most important characteristics. The smaller the isolated linewidth, the narrower the FET gate that can be formed. Since a FET's maximum switching frequency and area-density both increase as the gate is narrowed, the ability to reduce the width of the isolated line translates directly into the ability to produce faster, more densely populated integrated circuits.

MICROLITHOGRAPHIC PRINTING MACHINES

Microlithographic printing is performed by a machine known as an "aligner" for its ability to align a wafer to a pattern transfer tool. The manner in which the wafer is aligned to the pattern transfer tool depends on whether the pattern transfer tool is a mask or a reticle. If the pattern transfer tool is a mask, the wafer is aligned to the mask once, then all of the wafer die are exposed at the same time. However, if the pattern transfer tool is a reticle, the reticle pattern is transferred to only one (or a few) wafer die per exposure. After each exposure, a stage to which the wafer is mounted is stepped to align the next die for exposure through the reticle and the print is repeated. Such aligners are referred to as "step and repeat aligners," "steppers" or, in some cases, "scanners" (a scanner is stepper in which exposure through the reticle is achieved by scanning the reticle with the radiant energy source. Herein, the term stepper is used to mean any step and repeat device, including a scanner). Since the step and repeat print process must be performed potentially as many times as there are die in the wafer, the step and repeat process is considerably more time consuming than a single-exposure mask process. However, since a much smaller area of the wafer is printed per exposure, the reticle pattern may be an enlargement of the pattern to be printed and therefore easier to fabricate. Also, stepping each die allows wafer distortion to be compensated on a die by die basis.

Modern microlithographic printers are said to be diffraction limited. That is, diffraction of light passing through clear regions within a pattern transfer tool such as a mask or reticle, and not defects in the elements of the optical path, limit the minimum isolated linewidth achievable with a given machine. Radiation spreads out from the individual slits on the pattern transfer tool to regions on the wafer that are not intended to be exposed. At some point, the slits, or clear regions, of the pattern transfer tool become so close together that their resultant images cannot be resolved on the wafer surface. The minimum distance between pattern transfer tool features has been shown to be proportional to the wavelength of light used to irradiate the wafer and inversely proportional to the numerical aperture (NA) of the objective lens used to collect light diffracted from the pattern transfer tool and focus it onto the wafer.

Reducing minimum feature size by increasing the NA of the objective lens is difficult and involves tradeoffs in other aspects of the fabrication process. The depth of focus of a lens, for example, is inversely proportional to the square of the lens NA so that increased NA results in exponentially decreased depth of focus. If the depth of focus becomes too small, variations in wafer flatness can render regions of the wafer outside the focal plane. Aside from the depth of focus problem, increased lens NA generally requires a larger diameter lens, meaning that lens NA can be increased only up to a practical limit.

Reducing minimum feature size by shifting the irradiating wavelength deeper into the UV region also presents difficulties. As the irradiating wavelength is shortened, the brightness of existing light sources is severely reduced and the optical elements in the printer absorb more of the energy passing through them. As a consequence, the total energy incident on the resist is reduced. Longer exposure times are required resulting in reduced throughput.

Since the irradiating wavelength and the lens NA are generally fixed for a given printer, the printer is subject to rapid obsolescence as feature sizes shrink. Consequently, printers incorporating the latest technology and purchased at enormous cost may become unable to support fabrication of flagship products within just a few years.

It would be desirable, therefore, to provide a method and apparatus for printing an isolated line having a critical dimension smaller than that obtained on a printing machine employing existing printing techniques.

BRIEF SUMMARY OF THE INVENTION

A double shift print is employed to print a feature having a reduced critical dimension on a semiconductor wafer. The semiconductor wafer is positioned at a first position relative to a pattern transfer tool so that, when exposed to radiant energy through the pattern transfer tool in a first exposure, a first region of the wafer is exposed that defines some, but not all, sides of the feature. Next, the wafer is positioned at a second position relative to the pattern transfer tool so that, when exposed to radiant energy through the pattern transfer tool in a second exposure, a second region of the wafer is exposed that defines the remaining sides of the feature.

An apparatus for performing a double shift print includes a source mount to receive a radiant energy source, a pattern mount to receive a pattern transfer tool, a stage having a wafer mount to receive a semiconductor wafer, and a stage positioner coupled to drive the stage. The source mount, pattern mount and stage are disposed relative to one another such that radiant energy from a radiant energy source mounted in the source mount passes through a pattern transfer tool mounted in the pattern mount and is received on a wafer mounted on the stage. In one embodiment, the stage positioner drives the stage to a first position to expose a first region of the wafer to radiant energy passing through the pattern transfer tool, then to a second position to expose a second region of the wafer to radiant energy passing through the pattern transfer tool. The first and second regions each partially define the feature.

In an alternative embodiment of the apparatus for performing a double shift print, a pattern transfer tool actuator is provided to move the pattern transfer tool after the exposure of the first region of the wafer. The travel of the pattern transfer tool can be precisely controlled so that, after the first region is exposed to radiant energy, activation of the radiant energy source can be maintained while the pattern transfer tool is moved to expose the second region of the wafer.

In yet another embodiment of the apparatus for performing a double shift print, a dual-reticle pattern transfer tool is employed to expose two wafer die at once. The dual-reticle pattern transfer tool includes two reticles having essentially identical patterns thereon, but with each pattern being offset from the center of its respective reticle in a direction opposite the other. By exposing a die first to radiant energy passed through one of the two reticles, and then to radiant energy passed through the other of the two reticles, a double shift print is achieved. Since, except in the case of a perimeter die, two die are exposed after each repositioning of the wafer relative to the pattern transfer tool, the total number of repositioning steps is significantly reduced compared to the number of repositioning steps required in a single-reticle pattern transfer tool.

DETAILED DESCRIPTION OF THE INVENTION

A method and apparatus for printing a feature having a reduced critical dimension on a semiconductor wafer are described below. Although numerous specific details are set forth in order to provide thorough understanding of the present invention, it will be apparent to one skilled in the art that the present invention may be practice without such specific details.

Figure 1A:
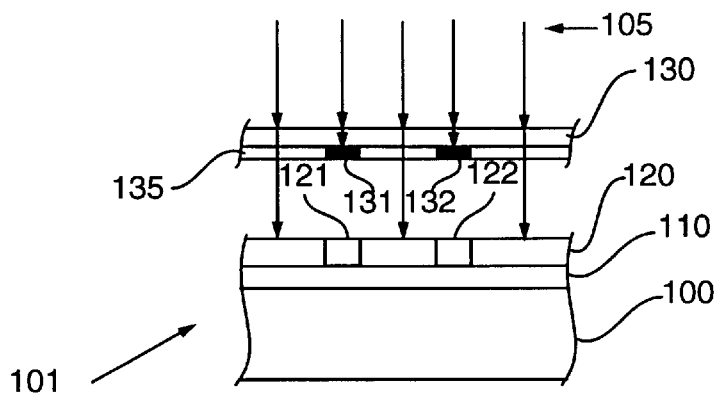
FIG. 1A illustrates the exposure step of a microlithographic process according to the prior art.
Figure 1B:
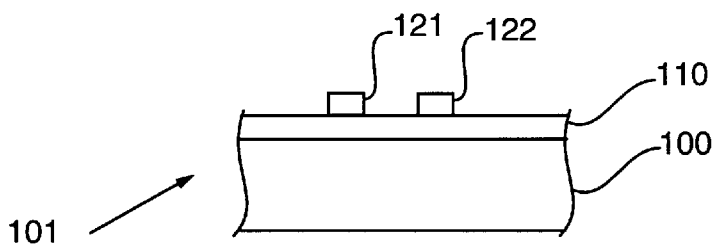
FIG. 1B illustrates a semiconductor wafer after the development step of a microlithographic process according to the prior art.
Figure 1C:
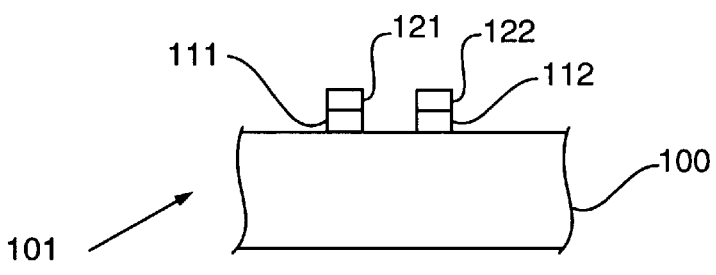
FIG. 1C illustrates a semiconductor wafer after the etching step of a microlithographic process according to the prior art.
Figure 2A:
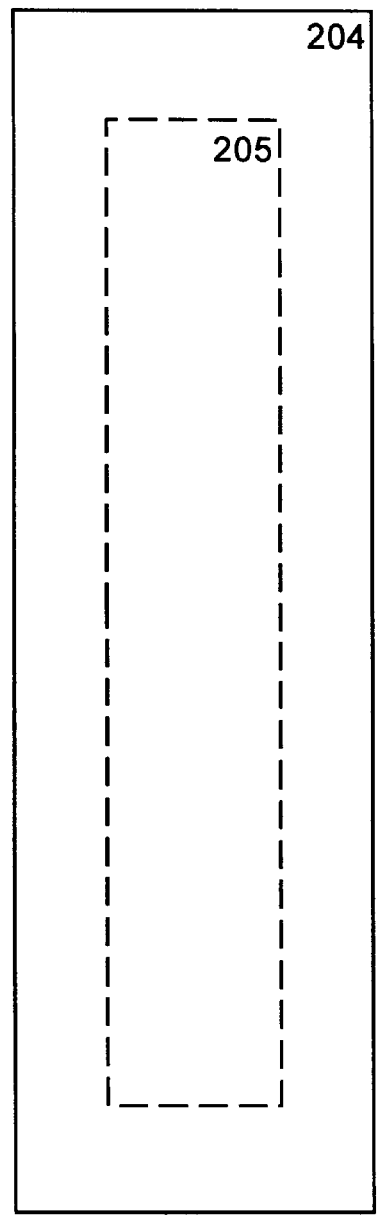
FIG. 2A illustrates the relationship between a feature printed using prior art techniques and feature printed according to the present invention.

FIG. 2A depicts a feature 204 having a critical dimension that can be achieved using prior art techniques and a given optical system. Feature 205, indicated by a dashed line, has a yet smaller critical dimension and can be achieved by the method and apparatus of the present invention, but using an optical system having the same limitations as that used to print feature 204.

Figure 2B:
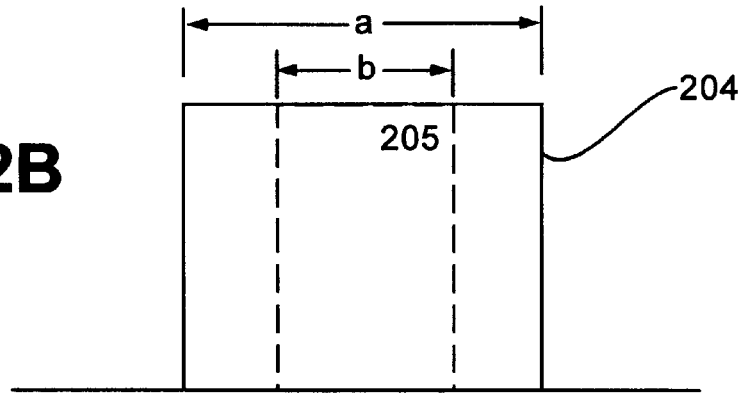
FIG. 2B depicts a profile view of the features shown in FIG. 2A.

FIG. 2B depicts a profile view of features 204 and 205 to emphasize their respective critical dimensions, "a" and "b". Diffraction effects limit the critical dimension achievable with prior art techniques to dimension "a", while the double shift print of the present invention can be used to reduce the critical dimension to "b".

Method for Performing a Double Shift Print

Figure 3:
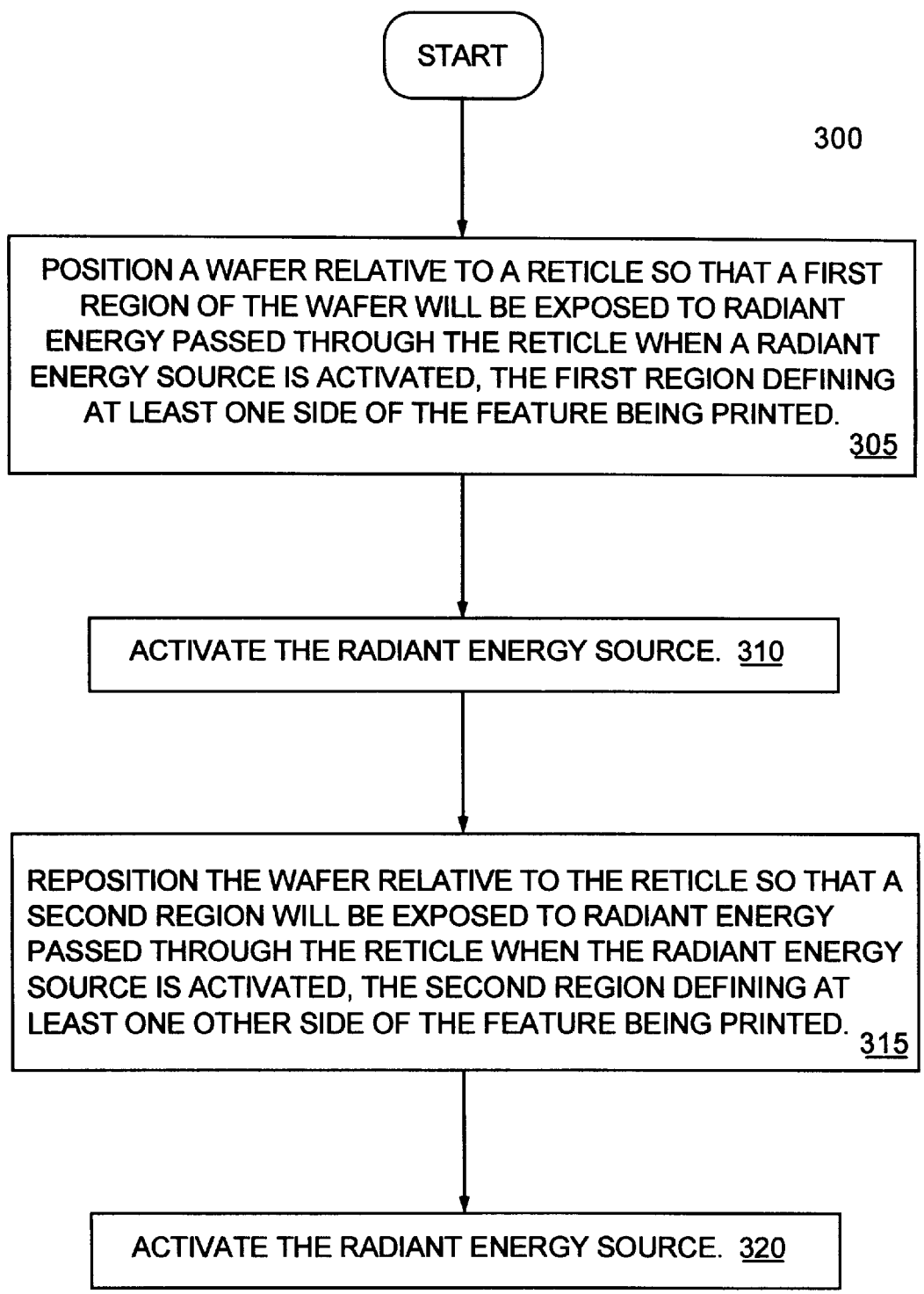
FIG. 3 illustrates a method according to the present invention.

FIG. 3 illustrates a method 300 for printing a feature on a photoresist-coated semiconductor wafer according to the present invention. The geometry of the feature to be printed is defined by an opaque region on a pattern transfer tool such as a mask or reticle. To simply the concepts involved in the following description, the opaque region on the pattern transfer tool, and hence the feature to be printed on the wafer, is assumed to be a rectangle. Nevertheless, it will be readily appreciated that a variety of feature geometries can be printed with the method of the present invention. Also, though a reticle is discussed below, the pattern transfer tool may be a mask or any other tool for transferring an image thereon to an object wafer.

First Shift and Exposure

At step 305 of method 300 the wafer is positioned at a first position relative to the reticle so that a first region of the wafer will exposed to radiant energy passed through the reticle. An opaque rectangle on the reticle defines the first region so that, when the radiant energy source is activated at step 310, the wafer is exposed in a pattern defining a first non-exposed rectangular region and also defining two sides of the feature being printed.

Figure 4:
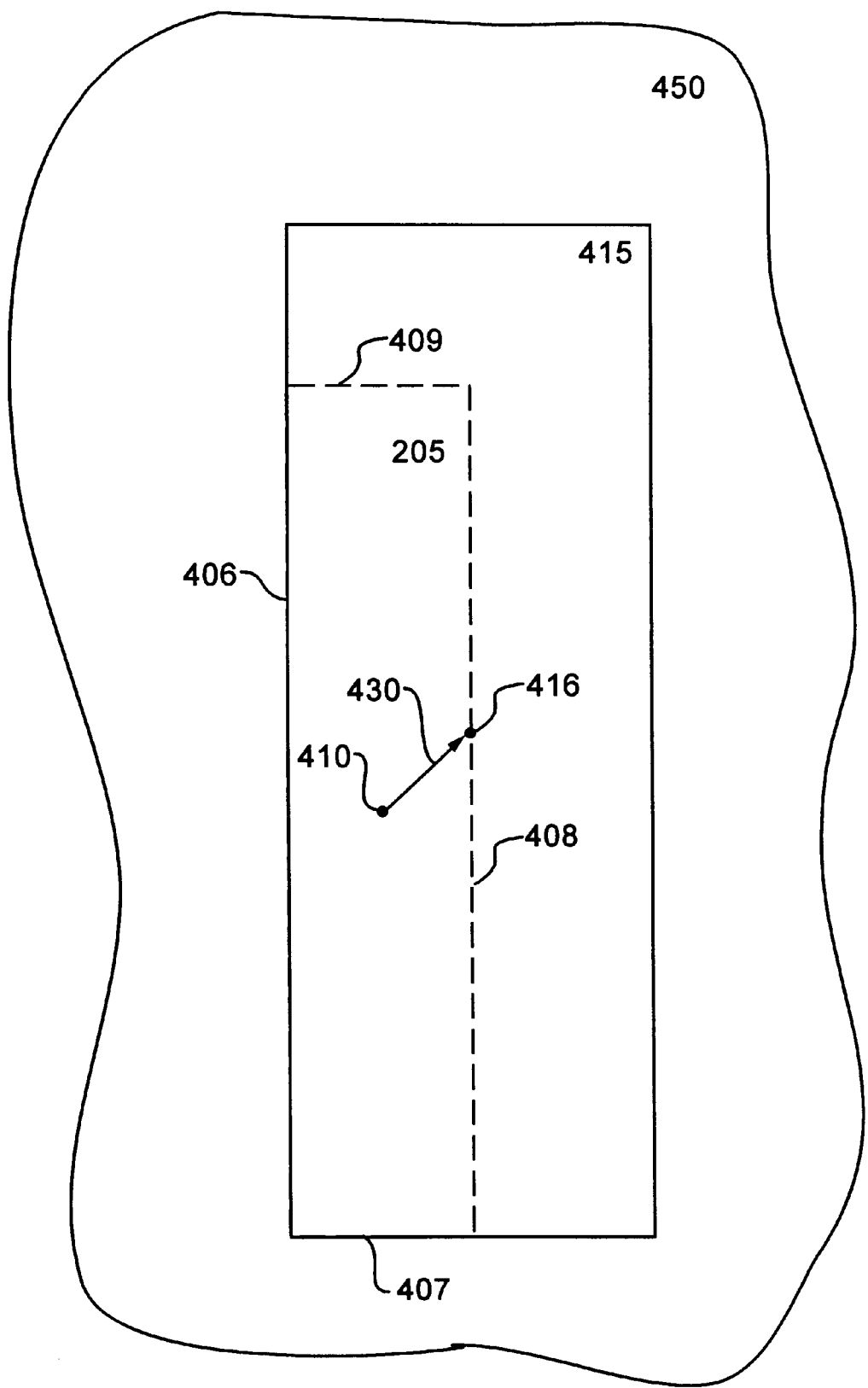
FIG. 4 illustrates the configuration of exposed and non-exposed regions on a semiconductor wafer resulting from a print at a first shifted position.

FIG. 4 depicts the configuration of the wafer regions described above after step 310 of method 300 has been performed. If developer is applied to the wafer at this point, photoresist in the first exposed region 450 will be removed leaving the first non-exposed region 415. As FIG. 4 illustrates, the non-exposed region 415 includes the feature being printed 205. Sides 406 and 407 of feature 205 are defined by sides of the non-exposed region 415. It will be appreciated that, since the exposed region 450 defines the non-exposed region 415, the exposed region 450 can also be said to define sides 406 and 407 of the feature 205. Sides 408 and 409 of feature 205 are shown as dotted lines to emphasize that they have not yet been defined by an exposure.

One skilled in the art will appreciate that, due to diffraction effects, non-exposed region 415 will be at least partly exposed to radiant energy. However, because the energy dosage is insufficient to render region 415 soluble in developer, region 415 is considered to be substantially unexposed and referred to for convenience as a non-exposed region.

It is significant that non-exposed region 415 is not centered over feature 205 as it would be in a usual lithographic printing process. The non-exposed region 415 is said to be "offset" from the feature 205 by the distance and direction indicated by vector 430. Thus, vector 430, which extends from the area-centroid 410 of feature 205 to the area-centroid 416 of non-exposed region 415, represents a positional shift of non-exposed region 415 relative to the feature 205 being printed. It will be appreciated that, depending on the previous position of the wafer relative to the reticle, the positional shift represented by vector 430 and the motion necessary to position the wafer in step 305 of method 300 are not necessarily the same. In any case, the positional shift represented by vector 430 is the first positional shift of a double shift print.

Second Shift and Exposure

Returning to method 300 of FIG. 3, at step 315 the wafer is repositioned relative to the reticle so that a second region of the wafer will be exposed to radiant energy passed through the reticle. At step 320, the wafer is exposed in a pattern defining a second non-exposed region and also defining the remaining sides of the feature being printed. It will be appreciated that the second non-exposed region is only a non-exposed region insofar as the exposure at step 320 is concerned. That is, the second non-exposed region includes a subregion exposed during exposure step 310. Similarly, the first non-exposed region, discussed above in reference to exposure step 310, includes a subregion exposed during exposure step 320.

Figure 5:
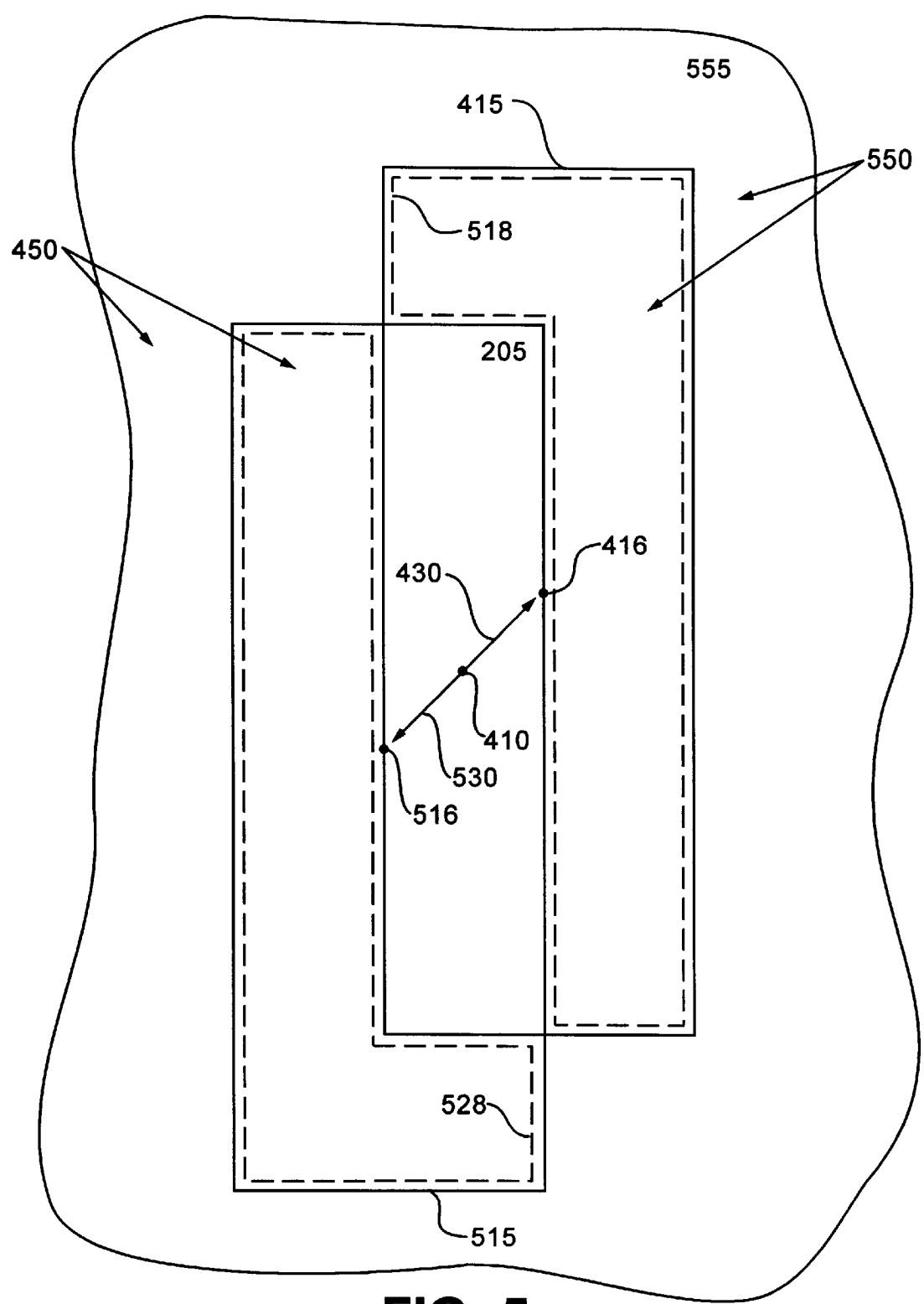
FIG. 5 illustrates the configuration of exposed and non-exposed regions on a semiconductor wafer resulting from a print at a second shifted position.

FIG. 5 depicts the configuration of the various wafer regions after step 320 of method 300 is performed. The first exposed region 450, resulting from exposure step 310, includes region 555 and an exposed subregion 528 of second non-exposed region 515. The second exposed region 550, resulting from exposure step 320, includes region 555 and an exposed subregion 518 of first non-exposed region 415. Thus, feature 205 is fully defined by exposed subregions 518 and 528, or, said another way, by the overlapping of first non-exposed region 415 by second non-exposed region 515. After developer is applied to dissolve the exposed photoresist regions, feature 205 will remain.

As stated above, vector 430 extends from the area-centroid 410 of feature 205 to the area-centroid 416 of non-exposed region 415 and represents the first positional shift of a double shift print. Similarly, vector 530 extends from the area-centroid 410 of feature 205 to the area centroid 516 of non-exposed region 515 and represents the second positional shift of the double shift print. Again, vectors 430 and 530 represent positional shifts of non-exposed regions 415 and 515 relative to the feature 205 being printed and are not necessarily indicative of movements necessary to position the wafer relative to the reticle. The movement of the wafer (or reticle) to successive exposure positions is discussed in more detail below in reference to FIG. 8.

In one embodiment of the present invention, the positional shifts represented by vectors 430 and 530 depicted in FIG. 5 are ideally of equal magnitude and opposite direction. Of course, since actual positioning systems have finite accuracy, positional shifts of substantially equal magnitude and substantially opposite direction must suffice (e.g., error less than 10%).

Magnitude of the Positional Shifts of a Double Shift Print

In practice, the magnitude of the positional shifts indicated by vectors 430 and 530 of FIG. 5 will depend on the critical dimension sought to be achieved by the double shift print and the resolution of the printer. In the context of a microlithographic printer, "resolution" refers to the critical dimension of a feature that can be printed in a single exposure during which the position of the wafer relative to the reticle remains fixed.

Figure 6:
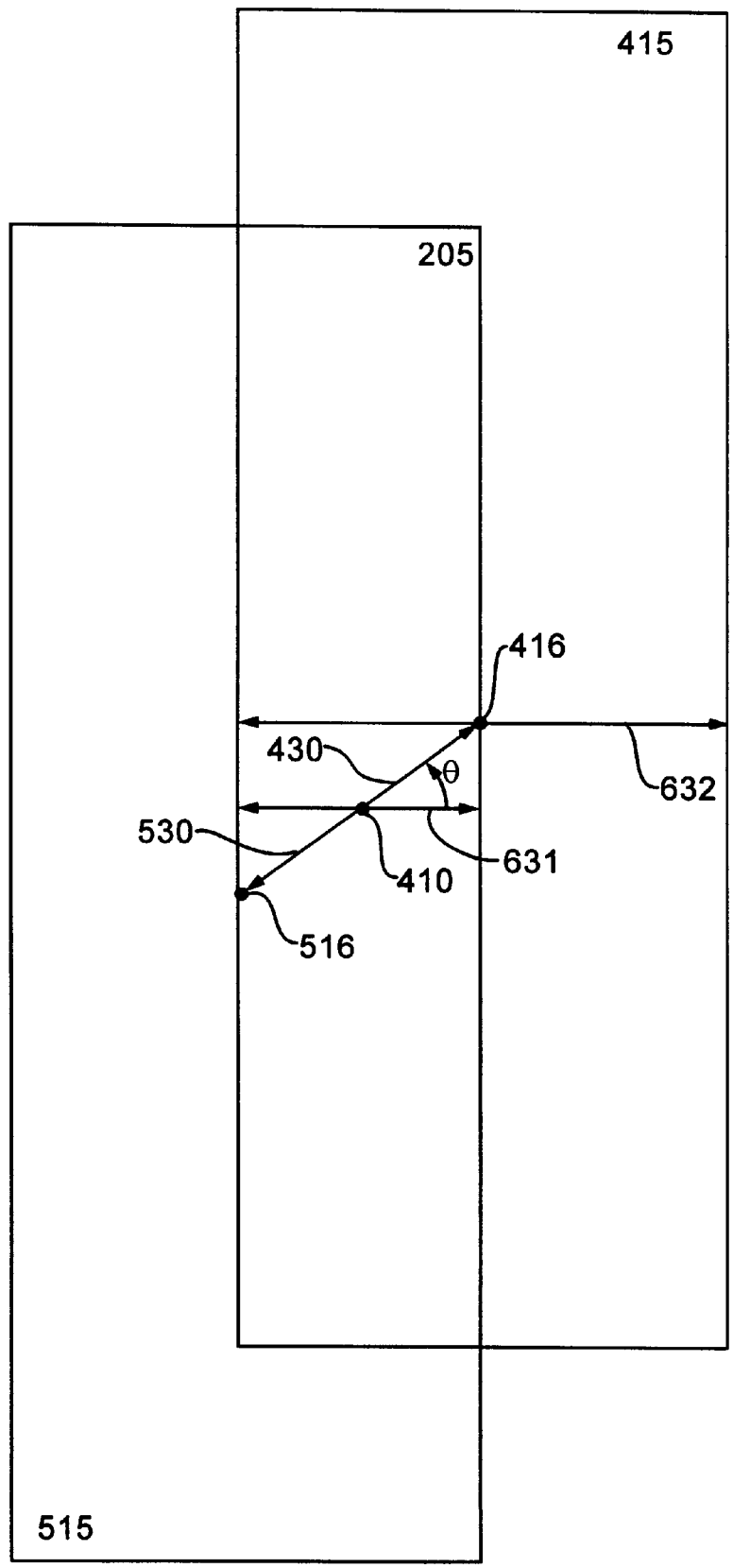
FIG. 6 illustrates the geometric relationship used to determine the magnitude of the first and second positional shifts.

FIG. 6 illustrates the geometric relationships used to determine the magnitude of the first and second positional shifts of a double shift print. First, to produce a feature having a critical dimension indicated by line 631 with a printer having a resolution indicated by line 632, each positional shift must have a component parallel to line 631 given by:

$$X = (R-CD)/2 \quad (1)$$

where X is the component of the positional shift parallel to an X-axis defined by line 631, R is the resolution of the printer indicated by line 632 and CD is the critical dimension of the feature sought to be printed indicated by line 631. If A is the magnitude of vector 430, and θ is the angle between vector 430 and line 631, then the relationship between the magnitude of vector 430 and X is:

$$X = A \cos(\theta) \quad (2)$$

Equations (1) and (2) can now be combined to solve for A:

$$A = (R-CD)/(2*\cos(\theta)) \quad (3)$$

In order to achieve a precise critical dimension, it has been found necessary to adjust the magnitude of the positional shift to account for such process factors as the contrast of the photoresist and the degree of photoresist swelling during development. In practice, a compensation factor for a given process, K, is empirically determined based on the critical dimension sought. In most cases K falls within the range 0.8 to 1.8. When the compensation factor, K, is included in equation (3), the expression for the magnitude of the positional shift indicated by vectors 430 and 530 becomes:

$$A = K*(R-CD)/(2*\cos(\theta)) \quad (4)$$

Based on equation (4), it will be appreciated that, for a printer having a given resolution, R, the magnitude of the positional shift, A, increases as the critical dimension, CD, decreases. The maximum positional shift occurs as the critical dimension, CD, approaches zero and θ equals π/4 radians. In that case, the magnitude of the positional shift, A, is given by: $A = K*R/\sqrt{2}$. Since, when a wafer is positioned at a first shifted position for a first exposure and then repositioned to a second shifted position for a second exposure, the distance between the first and second shifted positions is 2*A (assuming oppositely directed positional shifts), the maximum distance between the first and second shifted positions will generally be less than $K*R*\sqrt{2}$.

Compensation Shift

The angle θ can be used to introduce a difference between the magnitudes of the X-axis and Y-axis components of a positional shift. This difference is referred to as a "compensation shift" and can be useful in a microlithographic process that exhibits a systematic difference in the critical dimension of horizontal (X-axis aligned) and vertical (Y-axis aligned) features. For example, if the mean difference in the critical dimension between horizontal and vertical features is D, then a compensation shift can be introduced by a first positional shift having X and Y-axis components given by: x=a,y=a−(D/2). The second positional shift would have X and Y-axis components given by: x=−a, y=−a+(D/2). The magnitude, A, of the first positional shift is equal to the magnitude of the second positional shift and is given by:

$$A = (2a^2 - a*D + D^2/4)^{1/2} \quad (5)$$

The angle θ, which represents the direction of the first positional shift relative to the X-axis defined by line 631, is given by:

$$\theta = \tan^{-1}(1 - D/2a) \text{ radians} \quad (6)$$

The angle of the second positional shift is θ+π radians.

If D is positive, the compensation shift has the effect of reducing the mean critical dimension of horizontal features to match the mean critical dimension of vertical features. If D is negative the compensation shift has the effect of increasing the mean critical dimension of horizontal features to match the mean critical dimension of vertical features. Of course, the compensation shift could also be applied to the X-axis component of the positional shifts to increase or reduce the mean critical dimension of vertical features. If no compensation shift is to be introduced, then the angle θ is π/4 (or 3 π/4) radians and the expression for A reduces to:

$$A = K*(R-CD)/\sqrt{2} \quad (7)$$

To apply the equations developed above, consider, for example, the Nikon Body-11 i-line stepper which prints with 365 nm light (the "i-line" of a mercury-vapor lamp) and has a resolution of 370 nm. A feature having a critical dimension at least as low as 200 nm can be achieved by reconfiguring the printer to perform a double shift print with the magnitude of each positional shift being $1.5*(370-200)/\sqrt{2}=180$ nm (1.5 being the empirically determined compensation factor and assuming no compensation shift).

Likewise, a DUV (deep ultraviolet) stepper having a resolution of approximately 248 nm can be reconfigured to double shift print a feature having a critical dimension at least as low as 150 nm. In such a case, the magnitude of each positional shift is: $1.4*(248-150)/\sqrt{2}=97$ nm (again, 1.4 being the empirically determined compensation factor and assuming no compensation shift). A 193 nm resolution DUV stepper can be reconfigured to double shift print a feature having a critical dimension at least as low as 100 nm. In that case, the magnitude of each positional shift is: $1.4*(193-100)/\sqrt{2}=92$ nm. Thus, by reconfiguring a printer to perform a double shift print and without changing any element of the optical system, including the reticle, a substantially reduced critical dimension can be achieved.

Apparatus for Performing a Double Shift Print

Figure 7:
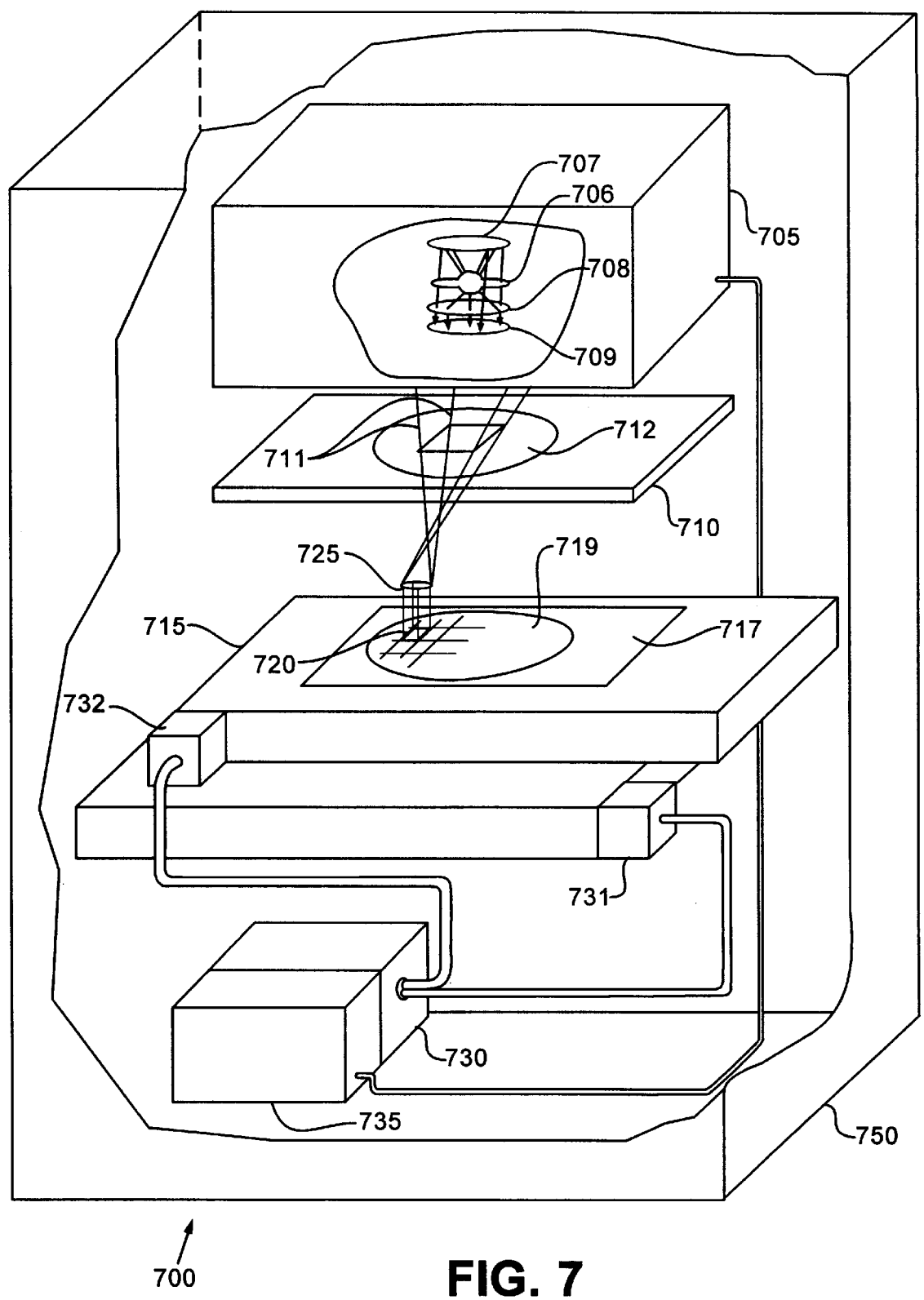
FIG. 7 depicts an apparatus for printing a feature on a semiconductor wafer.

FIG. 7 depicts an apparatus 700 for performing the method of the present invention. Apparatus 700 includes a source mount 705 to which a radiant energy source 706 is mounted, pattern mount 710 to which pattern transfer tool 712 is mounted, objective lens 725 mounted to a lens mount (not shown), stage 715 including wafer mount 717 to which wafer 719 is mounted, stage positioner 730 coupled to the stage 715 and exposure controller 735 coupled to the radiant energy source 706. Source mount 705, pattern mount 710, lens mount (not shown) for objective lens 725, stage 715, stage positioner 730 and exposure controller 735 are connected to frame 750.

In one embodiment of the present invention, radiant energy source 706 is a mercury-vapor lamp and source mount 705 includes a mirror 707 for back reflecting light rays emitted from source 706, a filter 708 for filtering radiant energy having wavelengths other than a selected irradiating wavelength, and a condensing lens 709 for focusing the filtered radiant energy onto a reticle. Activation of radiant energy source 706 is controlled by exposure controller 735. Exposure controller 735 includes a sensor (not shown) disposed within the path of radiant energy emitted by the radiant energy source to allow feedback-controlled activation of the radiant energy source 706. Since the output intensity of a mercury-vapor lamp varies over time, feedback-controlled activation is necessary to ensure that the radiant energy dosage received by a wafer is sufficient to exceed the threshold dosage (also known as the critical dosage) needed to bring about complete solubility of the exposed photoresist.

Pattern mount 710 is disposed relative to the source mount 705 so that radiant energy, depicted by lines 711, from the radiant energy source 706 passes through pattern transfer tool 712.

Stage 715 is positioned relative to pattern mount 710, objective lens 725 and source mount 705 so that radiant energy from radiant energy source 707 passing through pattern transfer tool 712 is focused on the surface of wafer 719 by objective lens 725. In the preferred embodiment of the present invention, lens 725 reduces the size of the reticle image transferred to the wafer by a factor of five or ten. Stage positioner 730 includes actuators 731 and 732 coupled to stage 715 for moving stage 715, and therefore wafer 719, to various positions relative to pattern transfer tool 712. Stage positioner 730 receives feedback from a position sensing device, such as a laser interferometer (not shown), so that stage 715 can be precisely positioned.

In one embodiment of the present invention, stage positioner 730 is configured to move the wafer 719 in a pattern relative to a stationary reticle 712 so as to position the wafer 719 for each print of the double shift print. The sequence of positions to which the wafer is moved may be determined by either hard-wired logic or a programmed processor comprised by stage positioner 730. In either case, stage positioner 730 positions stage 715 at a first position so that a first region of wafer die 720 can be irradiated and then at a second position so that a second region of wafer die 720 can be irradiated. As discussed above, the first and second regions of wafer die 720 each partially define features being printed within die 720. After the second region of wafer die 720 has been irradiated, the double shift print is completed and stage positioner 730 positions stage 715 to process the next die.

In order to coordinate the positioning of stage 715 and activation of radiant energy source 705, the stage positioner 730 may be configured to signal exposure controller 735 to activate the radiant energy source 706 when the wafer 719 is in position for exposure. Alternatively, another controller (not shown) may be provided to coordinate the operation of the stage positioner 730 and the exposure controller 735. Generally, any configuration of control components which can coordinate the operation of stage 715 and radiant energy source 706 is within the spirit and scope of the present invention.

Motion Required to Establish Positional Shifts

Figure 8:
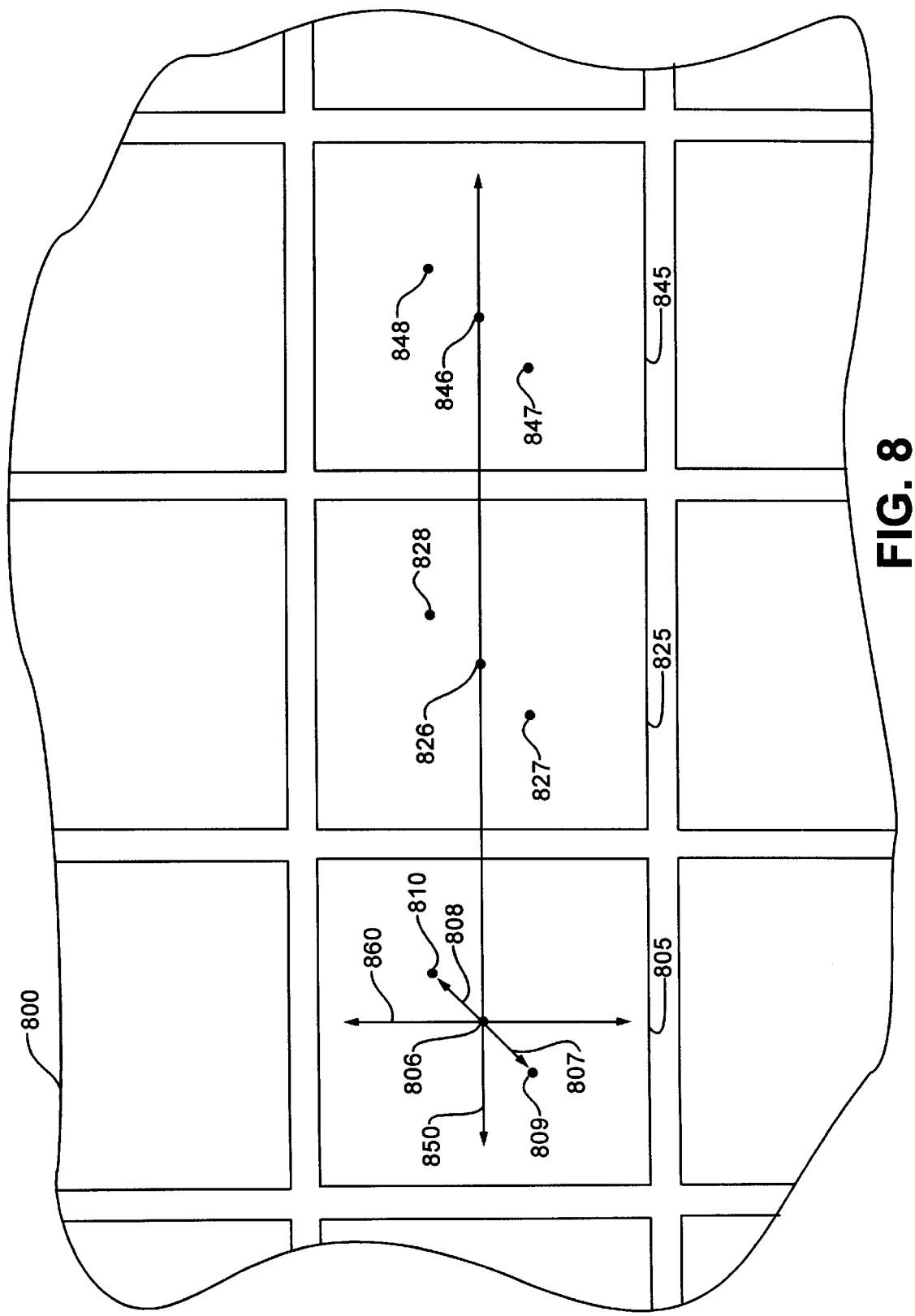
FIG. 8 depicts a portion of a semiconductor wafer to illustrates the sequence of motions involved in making a double shift print.

FIG. 8 depicts a portion of a semiconductor wafer 800 for the purpose of illustrating the sequence of motions involved in making a double shift print using the apparatus of FIG. 7. In a standard step and repeat process, wafer die 805 would be positioned so that its area-centroid 806 is optically aligned with the center of a reticle pattern (not shown). For reference, this is referred to as a "standard alignment" and the wafer 800 is said to be positioned at point 806. Die 805 would then be exposed and the wafer 800 stepped to area-centroid 826 of die 825 to repeat the standard alignment. Die 825 would then be exposed and the wafer 800 stepped to point 846, and so forth.

To make a double shift print on die 805 using the apparatus of FIG. 7, the wafer is first positioned at point 809 to establish a first positional shift having a magnitude (exaggerated for clarity) and direction indicated by vector 807. The die 805 is irradiated, then the wafer moved to point 810 to establish a second positional shift having a magnitude and direction indicated by vector 808. Note that if the magnitude of the first positional shift is $A_1$, the magnitude of the second positional shift is $A_2$, and the angle between the two positional shifts is $\pi$ radians, then the wafer 800 must be moved by a distance $A_1 + A_2$ relative to the reticle to reach position 810 from position 809. It should be clear, therefore, that the distance, $A_1 + A_2$, traveled by the stage (or reticle) to establish the second positional shift is not the same as the magnitude of the second positional shift, $A_2$.

After a second print at position 810, the wafer 800 is moved to position 827 to establish a first positional shift from standard alignment point 826 and the process repeated. Thus, wafer 800 is moved relative to the reticle to the sequence of positions 809, 810, 827, 828, 847 848, and so forth. Again, the positional shifts indicated by points 809, 810, 827, 828, 847 and 848 have been exaggerated for clarity. It will be appreciated that other sequences of positions might be used without departing from the spirit and scope of the present invention. For example, in the preferred embodiment of the present invention the sequence of exposure positions is chosen to minimize the number of stage direction changes by making a first shifted print on each wafer die (e.g., sequencing through points 808, 828, 848 . . . ) in a given row before returning to make a second shifted print on the same row of die (e.g., sequencing through points 847, 827, 807). In another embodiment, the sequence of positions might be chosen to minimize travel distance between successive exposure points.

Directionality of Positional Shifts

For the purpose of describing the directionality of the positional shifts of a double shift print, it is helpful to define a Cartesian coordinate system on wafer 800 of FIG. 8. A line 850 drawn through area-centroids 806 and 826 can be considered to define the X-axis of the coordinate system and a line 860 normal to line 850 to define the Y-axis of the coordinate system.

The direction of vectors 807 and 808 is significant because features printed on a wafer are generally aligned with at least one of the axes defined by lines 850 and 860. If some features are aligned with the X-axis (line 850) and others with the Y-axis, then, in order to define opposing sides of each feature with a double shift print, the direction of the positional shifts must be transverse to both axes 850 and 860. This is accomplished in the preferred embodiment by shifting the wafer position in directions having substantially equal X-axis and Y-axis components. Of course, a compensation shift, as described above, may be introduced to correct for systematic differences between the critical dimensions of X-axis aligned and Y-axis aligned features.

Based on the foregoing, it will be appreciated that if features to be printed on a wafer die are aligned exclusively with either the X-axis (line 850) or the Y-axis, then it is necessary only that the positional shifts of the double shift print be transverse to the axis of alignment. For example, if all features to be printed are aligned with the Y-axis, positional shifts along the X-axis alone will suffice to provide the double shift print effect.

Translating-Reticle Embodiment

Figure 9:
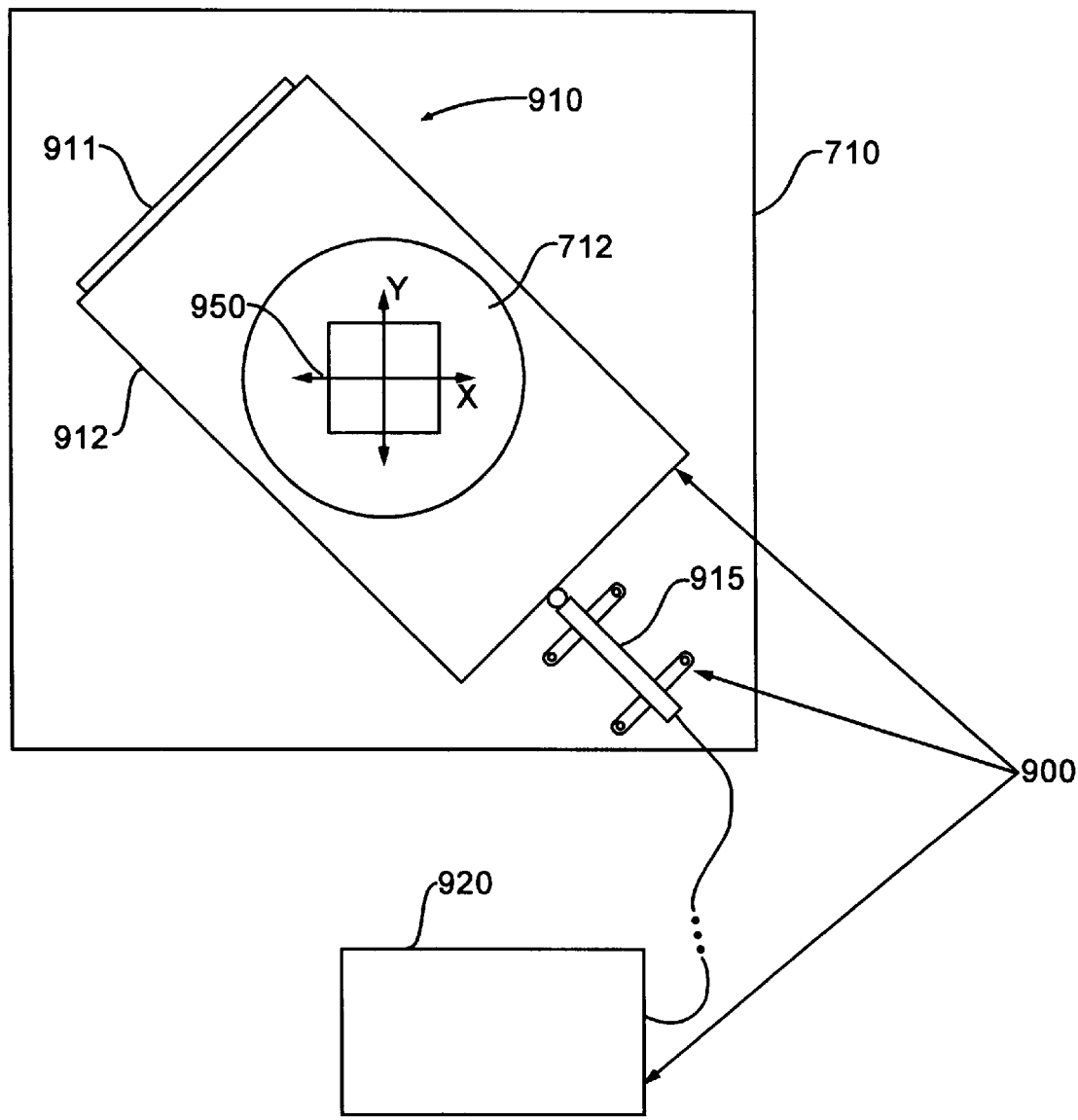
FIG. 9 depicts a pattern transfer tool actuator.

FIG. 9 depicts a pattern transfer tool actuator 900 that can be included in the apparatus of FIG. 7 to provide an alternative apparatus for performing the double shift print of the present invention. Pattern transfer tool actuator 900 includes a stage 910 for receiving a reticle 712 (or mask), a drive mechanism 915 such as a piezoelectric crystal or a voice coil, and a drive controller 920 for controlling the drive mechanism 915. The stage 910 includes a base 911 adjustably connected to pattern mount 710 and a table 912 movably connected to the base 911. The adjustable connection of base 911 to pattern mount 710 allows the direction of stage travel to be adjusted to introduce a compensation shift (discussed above), if necessary. The table 912 and base 911 of stage 910 both include openings so that radiant energy may be passed through the reticle 712 to irradiate a semiconductor wafer below (not shown).

It will be appreciated that the function of drive controller 920 may be incorporated into stage positioner 730 of FIG. 7. Further, though not shown, a laser interferometer or high-resolution positioning encoder may be used to provide position feedback to the drive controller 920.

When the apparatus 700 of FIG. 7 is modified to include pattern transfer tool actuator 900, the sequence of stage positions required to accomplish a double shift print is changed. Instead of moving the stage to reposition wafer 719 after the first print of the double shift print, pattern transfer tool actuator 900 moves the reticle relative to pattern mount 710 by an amount necessary to achieve the second positional shift of the double shift print. In this way, stage positioner 730 may be configured to move wafer 719 through a sequence of positions with one wafer die being double shift printed at each stage position. Of course, each of the sequence of positions would be a position offset from the standard alignment, as described above, but otherwise, the sequence of stage motions is identical to that required for a standard step and repeat process.

As shown in FIG. 9, stage 910 can be mounted to allow translation of table 912 (and therefore reticle 712) in a direction transverse to both the X and Y axes of X-Y coordinate system 950. This means that the path of motion between the first and second shifted positions of a double shift print can be as straight and well controlled as the motion of table 912. Since the distance traveled by table 912 will typically be well under 500 nm, an extremely straight and repeatable motion profile can be achieved. This is advantageous because it allows the reticle to be moved during the exposure of wafer 719. The radiant energy source 706 is activated while the wafer 719 is at the first shifted position relative to the reticle, and then the reticle is moved while activation of the radiant energy source 706 is maintained. In this way, the first exposure of wafer 719 at the first shifted position and the second exposure of wafer 719 at the second shifted position are both achieved in a single continuous exposure. Since the radiant energy source does not have to be deactivated (or shuttered) between the two exposures, and since the settling time of the single-axis stage 910 is less than that required after motion of the two-axis stage 715, time is saved and throughput increased.

Method for Performing a Double Shift Print with Translating Reticle

Figure 10:
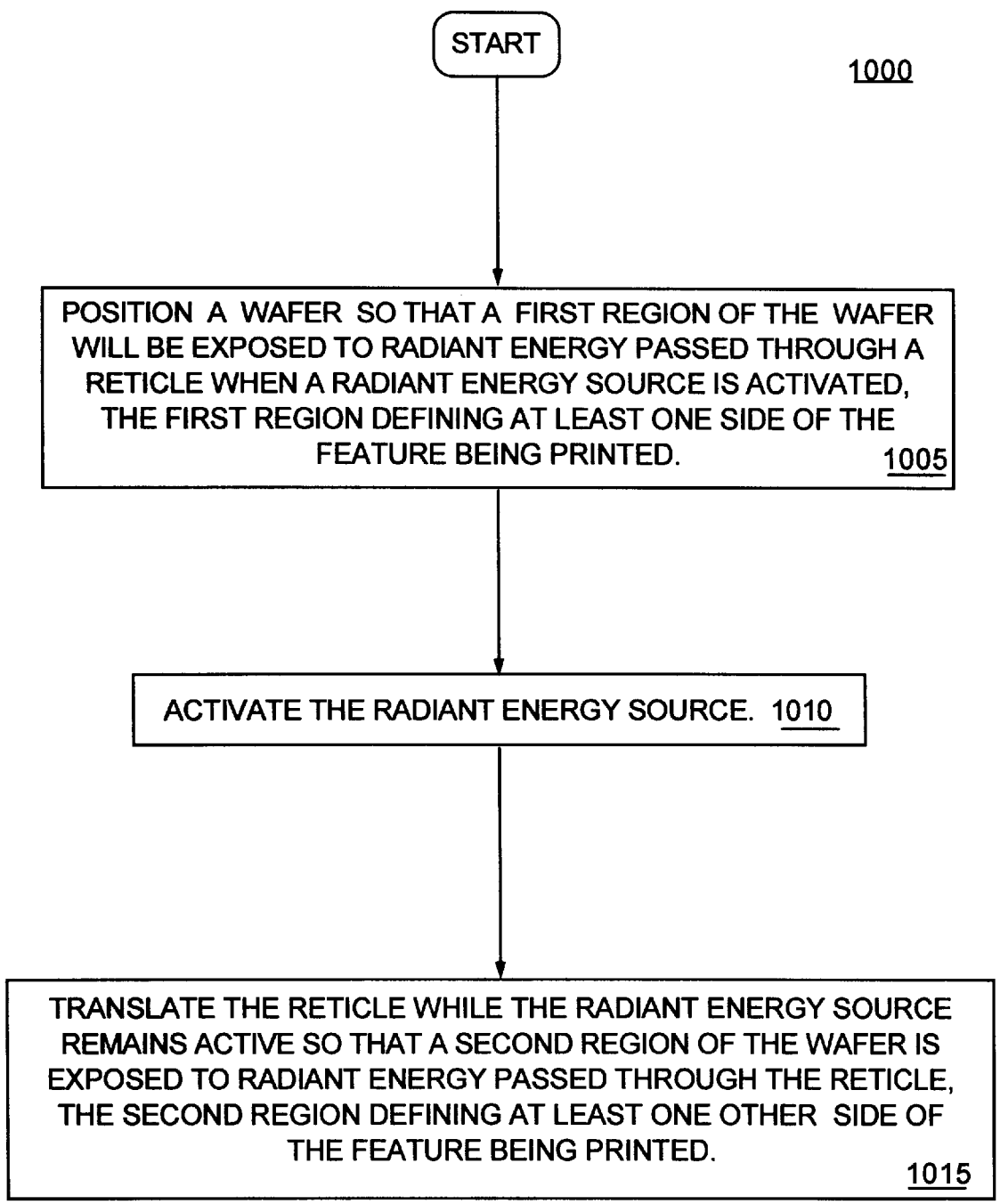
FIG. 10 illustrates a method for performing a double shift print in an apparatus including a pattern transfer tool actuator.

FIG. 10 illustrates a method 1000 for performing a double shift print in an apparatus including the reticle-translating mechanism described above. At step 1005, the wafer is positioned relative to the pattern transfer tool so that a first region of the wafer will be exposed to radiant energy passed through the reticle when a radiant energy source is activated. In the preferred embodiment, step 1005 is accomplished by positioning a stage to which the wafer is mounted. In any case, the first region defines at least one side of the feature being printed. At step 1010, the radiant energy source is activated. Then, at step 1015, while the radiant energy source remains activated, the reticle is translated to expose a second region of the wafer to radiant energy passed through the reticle. The second region defines the remaining sides of the feature being printed. Thus, according to method 1000, the step of exposing the first wafer region (1005) and the step of exposing the second wafer region (1015) are accomplished with a single activation (or single shutter opening) of a radiant energy source.

Apparatus for Printing with Dual-Reticle Pattern Transfer Tool

Figure 11:
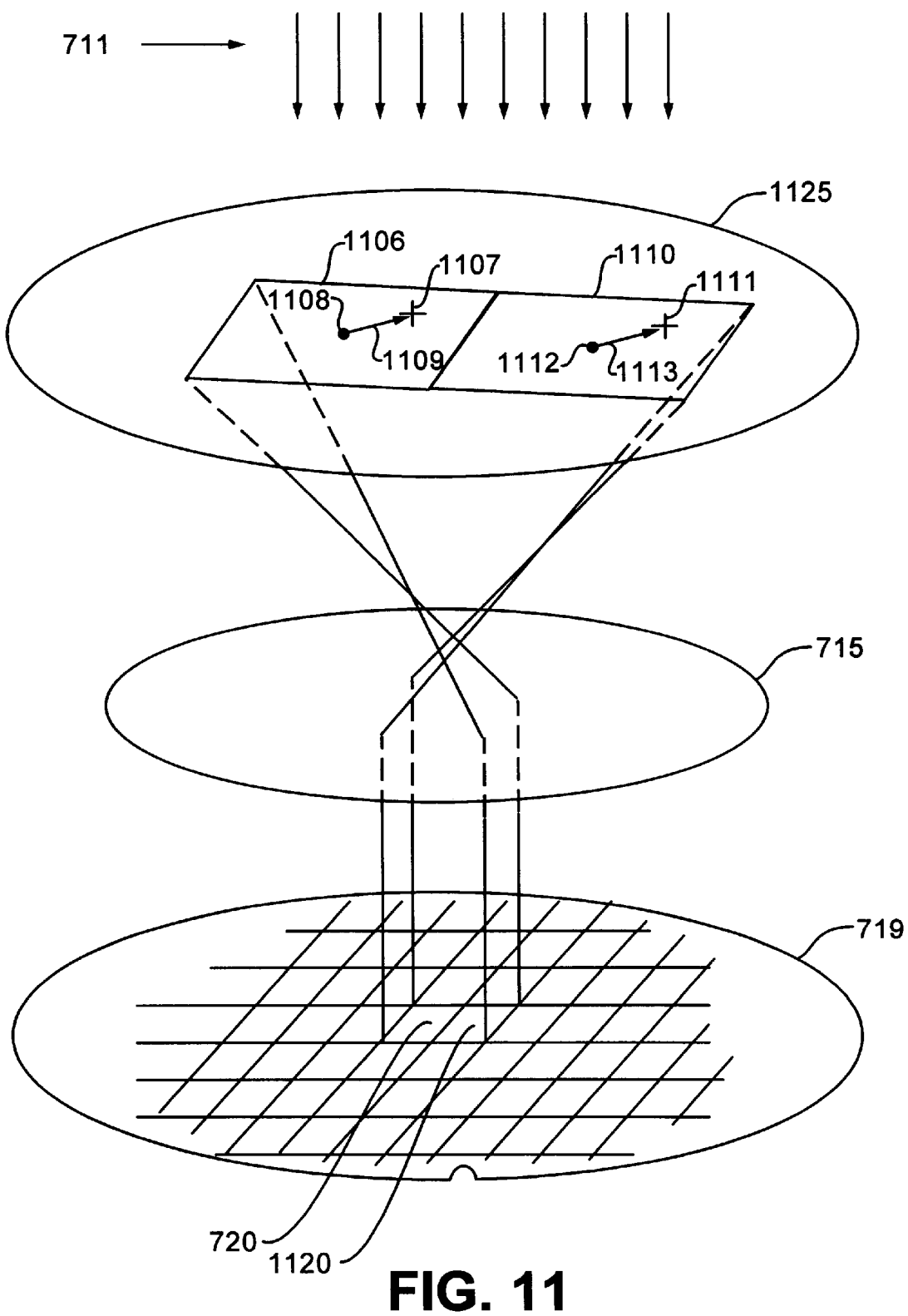
FIG. 11 depicts a pattern transfer tool having two reticle patterns thereon.

FIG. 11 depicts a pattern transfer tool 1105 having a two reticles (1106 and 1110) thereon. The patterns on the two reticles 1106 and 1110 are essentially identical except that they are offset from one another so that when a die is exposed to radiant energy passed through one of the reticles (1106 or 1110) and then to radiant energy passed through the other of the reticles, a double shift print is achieved. The two reticles 1106 and 1110 may either be part of an integrated whole or individual units.

The offset between the respective images on reticles 1106 and 1110 can be determined by locating the same feature in the pattern of each, determining each feature's distance from a fixed reference in the respective reticle, and comparing the two distances. For example, Vector 1109 represents the distance between an arbitrary feature 1107 in the pattern of reticle 1106 and the center 1108 of reticle 1106. Similarly, vector 1113 represents the distance between the same feature 1111 in the pattern of reticle 1110 and the center 1112 of reticle 1110. The difference between vectors 1109 and 1113 represents the offset between the respective patterns on reticles 1106 and 1110.

Figure 12:
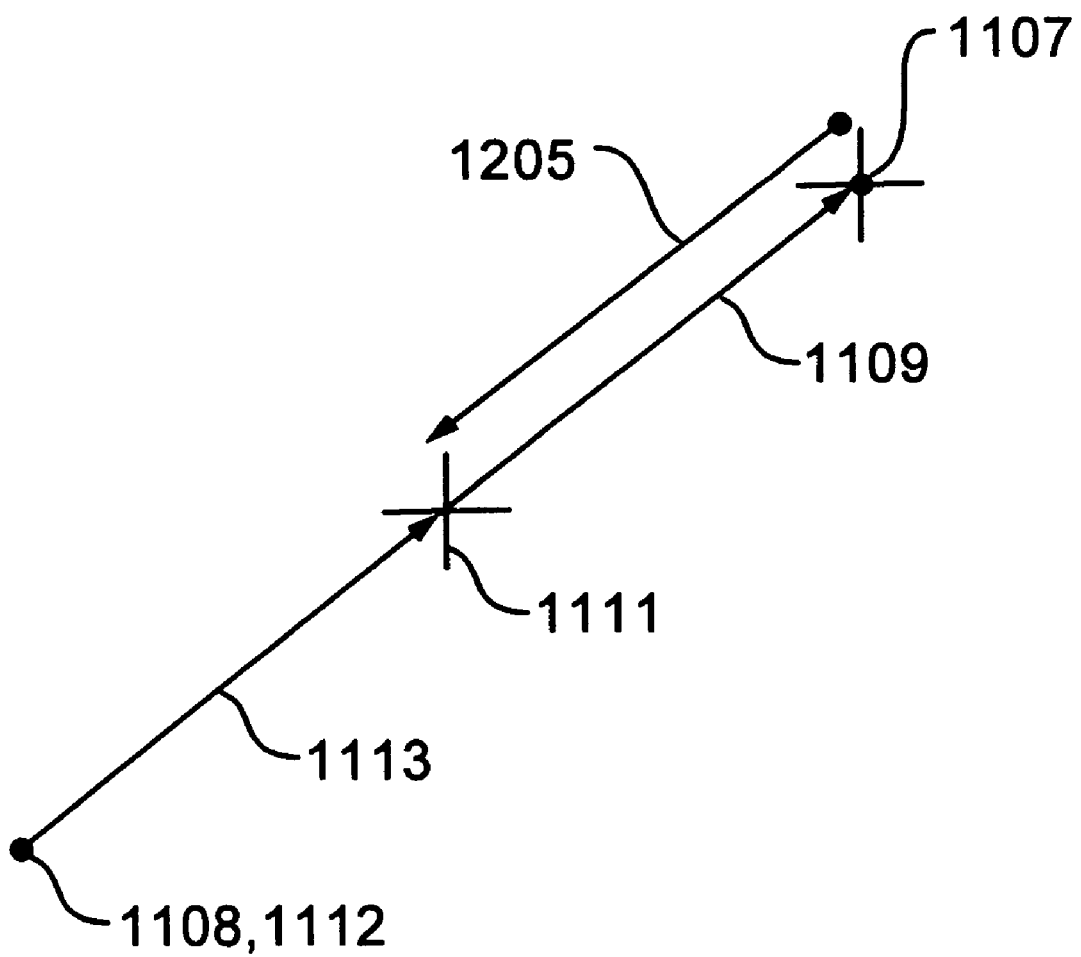
FIG. 12 illustrates the offset between the respective images on the reticle patterns of a dual-reticle transfer tool.

In FIG. 12, reticle 1106 has been superimposed on reticle 1110 to illustrate the offset between their respective patterns. By superimposing the reticles so that their centers 1108 and 1112 are coincident, it becomes clear that features 1107 and 1111 are offset from one another by the difference between vectors 1109 and 1113. This difference is represented by vector 1205. In the preferred embodiment, the images on reticle patterns 1106 and 1110 are each offset from the standard alignment discussed above by a magnitude equal to one-half the magnitude of vector 1205, and in directions opposite one another.

As illustrated in FIG. 11, pattern transfer tool 1105 can be used to expose two die (720 and 1120) in a single exposure. As mentioned above, the offset between the images on the two reticle patterns 1106 and 1110 can be chosen so that after a die has been exposed through reticle pattern 1106, the die can then be exposed through reticle pattern 1110 to achieve a double shift print. That is, the exposure of a wafer die to radiant energy 711 passed through reticle pattern 1106 (and focused by lens 715) constitutes a first shifted print, and the exposure of the die through reticle pattern 1110 constitutes a second shifted print. With regard to a rectangular feature printed on the die, two sides of the feature are defined by the exposure through reticle pattern 1106 and the other two sides of the feature are defined by the exposure through reticle pattern 1110.

A primary advantage achieved by the dual-reticle pattern transfer tool is that the number of motions necessary to double shift print a complete wafer, die by die, can be cut nearly in half. This is because, except in the case of perimeter die, two die are exposed after every repositioning step.

Figure 13:
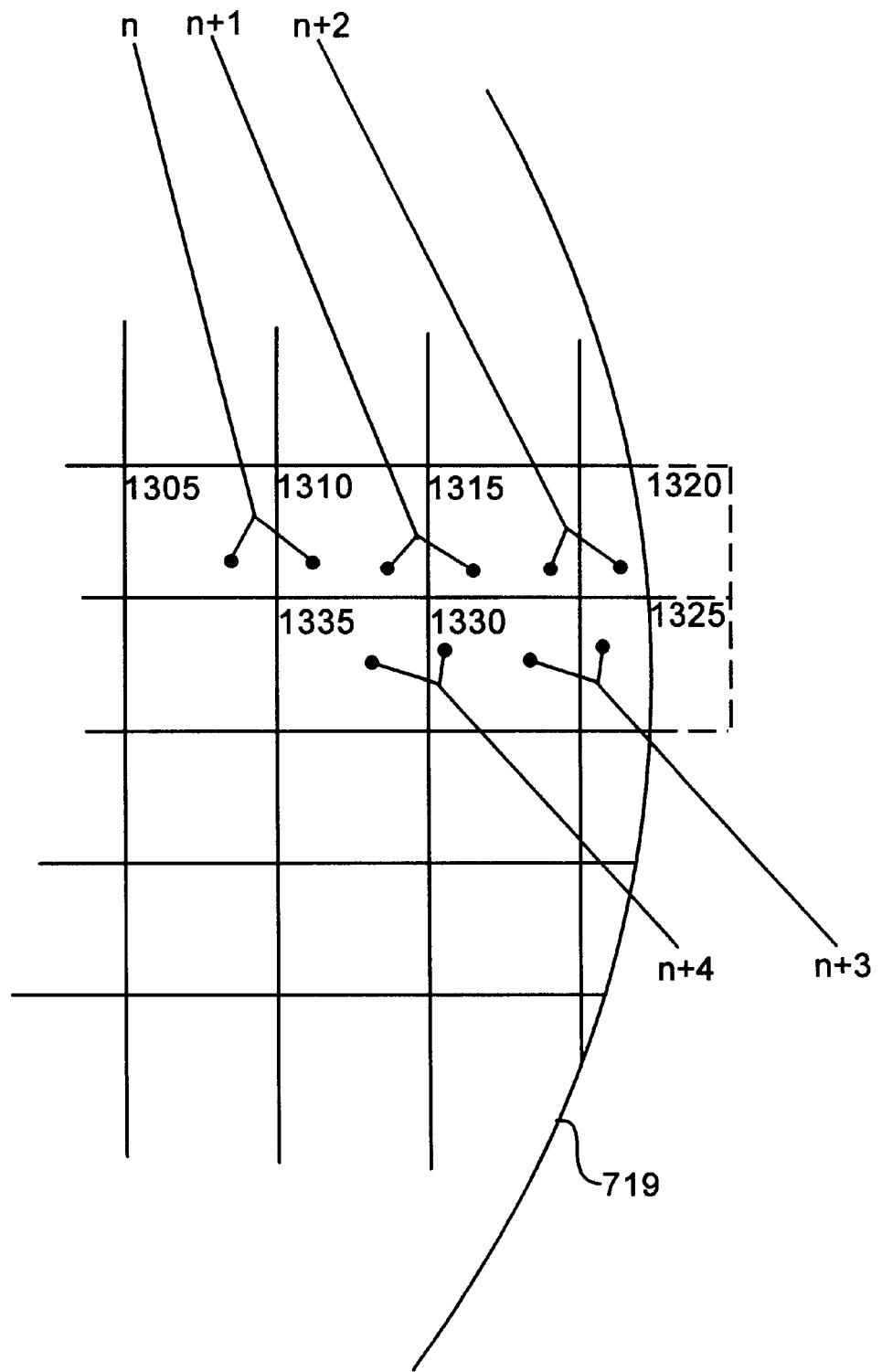
FIG. 13 illustrates the stepping sequence used to expose wafer die in an apparatus including dual-reticle pattern transfer tool.

FIG. 13 illustrates the stepping sequence used to expose wafer die when a dual-reticle pattern transfer tool is employed. Assume that n−1 exposures have already taken place and that die 1305 and 1310 are exposed in the $n^{th}$ exposure. A first shifted print was performed on die 1305 in the previous exposure (n−1, not shown), so that, when the second shifted print occurs at exposure n, a double shift print is achieved on die 1305. Similarly, since a first shifted print is performed on die 1310 at exposure n, repositioning the wafer and exposing die 1310 and 1315 in exposure n+1 achieves a double shift print on die 1310. Die 1315 is a perimeter die so that in exposure n+2, die 1315 is exposed through one of the two reticles of the dual-reticle pattern transfer tool to effect the second shifted print of a double shift print. During exposure step n+2, the other of the two reticles is not aligned over a die, but rather over unused region 1320. Thus, to double shift print a perimeter die involves at least one exposure when one of the two reticles is not aligned over a die. This situation occurs again in exposure n+3 when die 1330 is exposed through one of the two reticle patterns to effect a first shifted print. During exposure n+3, the other of the two reticle patterns is aligned over unused region 1325. The double shift print on die 1330 is then completed during exposure n+4, the same exposure that produces a first shifted print on die 1335. Thus, the total number of motions required to double shift print an entire wafer using a dual-reticle pattern transfer tool is equal to the total number of die plus the number of perimeter die. Compared to the apparatus of FIG. 7, the number of motions is reduced by the number of wafer die less the number of perimeter die. The net result is higher throughput.

A method and apparatus for printing a feature having a reduced critical dimension on a semiconductor wafer are thus described. While the present invention has been described in particular embodiments and through particular examples, the present invention should not be construed as limited by such embodiments and examples, but rather construed according to the following claims.

What is claimed is:

1. A method for printing a feature at a target region in a resist layer on a die, said method comprising:

positioning the die relative to a pattern transfer tool so that an opaque region of the pattern transfer tool is centered over a first region of the resist layer, the first region being from the target region in a first direction that includes a first offset component parallel to an edge of the die and a second offset component orthogonal to the first offset component, the first region including the target region and defining at least two sides of the feature;

projecting radiant energy through the pattern transfer tool in a first exposure to expose a region of the resist layer that surrounds the first region to a radiant energy dosage at least equal to a critical dosage of the resist layer;

repositioning the die relative to the pattern transfer tool so that the opaque region of the pattern transfer tool is centered over a second region of the resist layer, the second region being offset from the target region in a direction substantially opposite the first direction, the second region including the target region and defining at least two additional sides of the feature; and projecting radiant energy through the pattern transfer tool in a second exposure to expose a region of the resist layer that surrounds the second region to a radiant energy dosage at least equal to a critical dosage of the resist layer.

2. The method of claim 1 wherein at least one side of the two additional sides of the feature defined by the second region is opposite at least one side of the two sides of the feature defined by the first region.

3. The method of claim 1 wherein projecting radiant energy through the pattern transfer tool in a first exposure to expose a region of the resist layer that surrounds the first region to a radiant energy dosage at least equal to the critical dosage of the resist layer comprises inducing a chemical reaction in the region of the resist layer that surrounds the first region.

4. The method of claim 3 wherein inducing a chemical region in the region of the resist layer that surrounds the first region comprises rendering the region of the resist layer that surrounds the first region soluble in a developing solvent.

5. The method of claim 1 wherein projecting radiant energy through a pattern transfer tool in a first exposure to expose a region of the resist layer that surrounds the first region comprises projecting radiant energy through a reticle.

6. The method of claim 1 wherein positioning the die relative to the pattern transfer tool and repositioning the die relative to the pattern transfer tool each include moving the die to a respective position.

7. The method of claim 1 wherein positioning the die relative to the pattern transfer tool and repositioning the die relative to the pattern transfer tool each include moving the pattern transfer tool to a respective position.

8. The method of claim 1 wherein protecting radiant energy through the pattern transfer tool in a first exposure to expose a region of the resist layer that surrounds the first region comprises activating a radiant energy source and wherein projecting radiant energy through the pattern transfer tool expose a region of the resist layer that surrounds the second region comprises maintaining activation of the radiant energy source during repositioning the die relative to the pattern transfer tool.

9. A method for irradiating a plurality of die on a semiconductor substrate, said method comprising:

exposing each of the plurality of die to radiant energy through a first pattern on a pattern transfer tool; and exposing each of the plurality of die to radiant energy through a second pattern on the pattern transfer tool, the exposure of at least one of the plurality of die to radiant energy through the second pattern being concurrent with the exposure of at least one other of the plurality of die to radiant energy through the first pattern.

10. The method of claim 9 wherein exposing each of the plurality of die to radiant energy through a first pattern on a pattern transfer tool comprises irradiating a first region on each of the plurality of die, and wherein exposing each of the plurality of die to radiant energy through a second pattern on the pattern transfer tool comprises irradiating a second region on each of the plurality of die, the first and second regions defining respective opposing sides of a feature on each of the plurality of die.

* * * * *

UNITED STATES PATENT AND TRADEMARK OFFICE
CERTIFICATE OF CORRECTION

| | | |
|---|---|---|
| PATENT NO. | : 5,972,567 | Page 1 of 1 |
| APPLICATION NO. | : 08/772087 | |
| DATED | : October 26, 1999 | |
| INVENTOR(S) | : Hu | |

It is certified that error appears in the above-identified patent and that said Letters Patent is hereby corrected as shown below:

In column 1, line 15, delete "165", insert --105--.
In column 1, line 21, before "transfer", delete "135".
In column 1, line 22, before "of opaque", insert --135--.
In column 4, line 29, before "feature", insert --a--.
In column 4, line 42, delete "relationship", insert --relationships--.
In column 4, line 57, before "transfer tool", insert --pattern--.
In column 5, line 1, before "thorough", insert --a--.
In column 5, line 3, delete "practice", insert --practiced--.
In column 5, line 23, delete "simply", insert --simplify--.
In column 5, line 36, before "exposed", insert --be--.

Signed and Sealed this

Seventeenth Day of July, 2007

JON W. DUDAS
*Director of the United States Patent and Trademark Office*